United States Patent
Chen et al.

(10) Patent No.: US 7,297,918 B1
(45) Date of Patent: Nov. 20, 2007

(54) IMAGE SENSOR PACKAGE STRUCTURE AND IMAGE SENSING MODULE

(75) Inventors: Po-Hung Chen, Shin-Chu (TW); Mao-Jung Chen, Shin-Chu (TW); Chung-Chi Hsiao, Shin-Chu (TW)

(73) Assignee: Sigurd Microelectronics Corp., Shin-Chu (TW)

( * ) Notice: Subject to any disclaimer, the term of this patent is extended or adjusted under 35 U.S.C. 154(b) by 0 days.

(21) Appl. No.: 11/464,564

(22) Filed: Aug. 15, 2006

(51) Int. Cl.
  *H01J 40/14* (2006.01)
  *G02B 7/02* (2006.01)
(52) U.S. Cl. .................. 250/208.1; 250/239; 359/811
(58) Field of Classification Search ............ 250/239, 250/208.1; 359/311, 811; 257/680, 678
See application file for complete search history.

(56) References Cited

U.S. PATENT DOCUMENTS

| 6,559,439 | B1 * | 5/2003 | Tsuchida et al. ............ 250/239 |
| 6,946,316 | B2 * | 9/2005 | Glenn et al. ................... 438/64 |
| 7,092,174 | B2 * | 8/2006 | Yamaguchi et al. ......... 359/819 |
| 2006/0023107 | A1 * | 2/2006 | Bolken et al. ............... 348/335 |
| 2006/0192230 | A1 * | 8/2006 | Wood et al. ................. 257/234 |
| 2007/0064317 | A1 * | 3/2007 | Chen et al. .................. 359/811 |

* cited by examiner

Primary Examiner—John R. Lee
(74) Attorney, Agent, or Firm—Ming Chow; Sinorica, LLC

(57) ABSTRACT

An image sensor package structure and an image sensing module are proposed. A substrate, a frame and a light transparent layer are used to package an image sensing chip to form the image sensor package structure. The frame is mounted on the substrate and located around the image sensing chip. The top of the frame extends toward the image sensing chip and upwards to form a locking and placing portion with an L-shaped cross section. Bend positions of the locking and placing portion form a placement space formed to accommodate and position the light transparent layer. The structure is simple, the fabrication is easy, and the gluing and packaging operations can be facilitated. Moreover, when the image sensor package structure and a lens set are assembled into an image sensing module, a lens base with a smaller size can be used to shrink the package area.

10 Claims, 3 Drawing Sheets

IMAGE SENSOR PACKAGE STRUCTURE AND IMAGE SENSING MODULE

BACKGROUND OF THE INVENTION

1. Field of the Invention

The present invention relates to an image sensor package structure and, more particularly, to an image sensor package structure and an image sensing module capable of reducing the package area.

2. Description of Related Art

As shown in FIG. 1, a conventional CMOS image sensor package structure comprises a substrate 10, a frame 20, an image sensing chip 30 and a light transparent glass 40. Several metallization traces 11 are formed on the surface of the substrate 10. The frame 20 is adhered to the substrate 10 using a first glue layer 12. The image sensing chip 30 is adhered to the substrate 10. The image sensing chip 30 has a sensing region 31. The image sensing chip 30 uses metal wires 32 to connect the metallization traces 11 on the surface of the substrate 10 by means of wire bonding, thereby achieving electric connection between the image sensing chip 30 and the substrate 10. The light transparent glass 40 seals and covers on the substrate 10 using a second glue layer 13. This package structure can isolate external particles to make the CMOS image sensor truly sense the external environment.

The above package structure, however, has many limitations in the package area and volume, and is unsuitable to portable products. First, when wire bonding is performed, because there is a drop height between the image sensing chip 30 and the substrate 10, a corresponding wire bonding distance S1 is required. Moreover, because the frame 20 is first adhered onto the substrate 10 in the conventional packaging procedure, it is necessary to keep a distance S2 between the frame 20 and the metallization traces 11 on the substrate 10 to prevent the capillary from touching the frame 20. Besides, because an action of removing particles is performed before sealing the light transparent glass 40, the distance between the image sensing chip 30 and the frame 20 cannot be too small. Otherwise, the particles between the image sensing chip 30 and the frame 20 cannot be easily removed.

Some image sensor packaging methods capable of reducing the package volume have been developed later. For instance, in one packaging process, the image sensing chip is first mounted on the substrate, and the frame is then adhered onto the substrate to save the package size. However, when assembling with a common lens set, a lens base is still directly mounted outside the frame. Therefore, the relative volume cannot be shrunk. In another package structure, grooves are provided at the inside and outside of the top of the frame to install the light transparent glass and a lens base. But the frame cannot be easily manufactured during injection molding. Moreover, in order to accommodate the lens base, extra space outside the frame is wasted.

In yet another package structure, the top of the frame extends horizontally toward the image sensing chip. Two grooves are designed on the extending portion to bear a lens base and the light transparent glass. Although the size of the lens set of this package structure can be smaller than that of the frame, the requirement for the package accuracy is high so that precision production machines are required. Moreover, because the connection position of the light transparent glass and the groove of the frame is very close to the sensing region of the image sensing chip, glue material may easily flow to the surface of the image sensing chip during the gluing process to affect the production yield and quality.

SUMMARY OF THE INVENTION

A primary object of the present invention is to provide an image sensor package structure and an image sensing module, in which the top of a frame extends toward an image sensing chip and upwards to form a locking and placing portion with an L-shaped cross section, and bend positions of this locking and placing portion forms a placement place for accommodate and position a light transparent layer. Moreover, a lens set with a smaller size can be matched for assembly to shrink the package area so as to meet the requirement for miniaturized package of image sensor.

Another object of the present invention is to provide an image sensor package structure and an image sensing module, in which the top of a frame has a locking and placing portion with an L-shaped cross section, and the connection position of a light transparent layer and the frame can be limited within a placement space formed at bend positions of the locking and placing portion to facilitate the gluing operation and prevent glue material from flowing to the surface of the image sensing chip, thereby stabilizing the production yield and quality.

Yet another object of the present invention is to provide an image sensor package structure and an image sensing module, in which the top of a frame has a locking and placing portion with an L-shaped cross section. The structure is simple, the fabrication is easy, and the packaging operations can be easily aligned. No precision machines are required, hence saving the production cost.

To achieve the above objects, an image sensor package structure disclosed in the present invention comprises a substrate, an image sensing chip, a light transparent layer and a frame. Several metallization traces are formed on the surface of the substrate. The image sensing chip is mounted on the substrate, and uses more than one metal wire to achieve electric connection with the metallization traces on the surface of the substrate. The light transparent layer is located above the image sensing chip. The frame is mounted on the substrate and located around the image sensing chip. The top of the frame extends toward the image sensing chip and upwards to form a locking and placing portion with an L-shaped cross section. Bend positions of the locking and placing portion form a placement space to accommodate and position the light transparent layer. Because the locking and placing portion is located inside the frame, waste of extra frame size can be avoided.

Besides, the present invention can be assembled with a lens set with a smaller size into an image sensing module. For instance, in an embodiment of the present invention, a gap is provided at the outside of the bottom of a lens base of the lens set to be locked with the inside of the locking and placing portion of the frame to reduce the area and volume of the whole package structure, thereby accomplishing miniaturized package of image sensor.

In the present invention, the connection position of the light transparent layer and the frame is limited within the placement space formed at bend positions of the locking and placing portion to facilitate the gluing operation. Moreover, the present invention can raise the upper edge of the top of the frame to be higher than the upper edge of the light transparent layer to further prevent glue material from overflowing to the surface of the image sensing chip, thereby stabilizing the production yield and quality.

BRIEF DESCRIPTION OF THE DRAWINGS

The various objects and advantages of the present invention will be more readily understood from the following detailed description when read in conjunction with the appended drawing, in which.

DETAILED DESCRIPTION OF THE PREFERRED EMBODIMENTS

Figure 1:
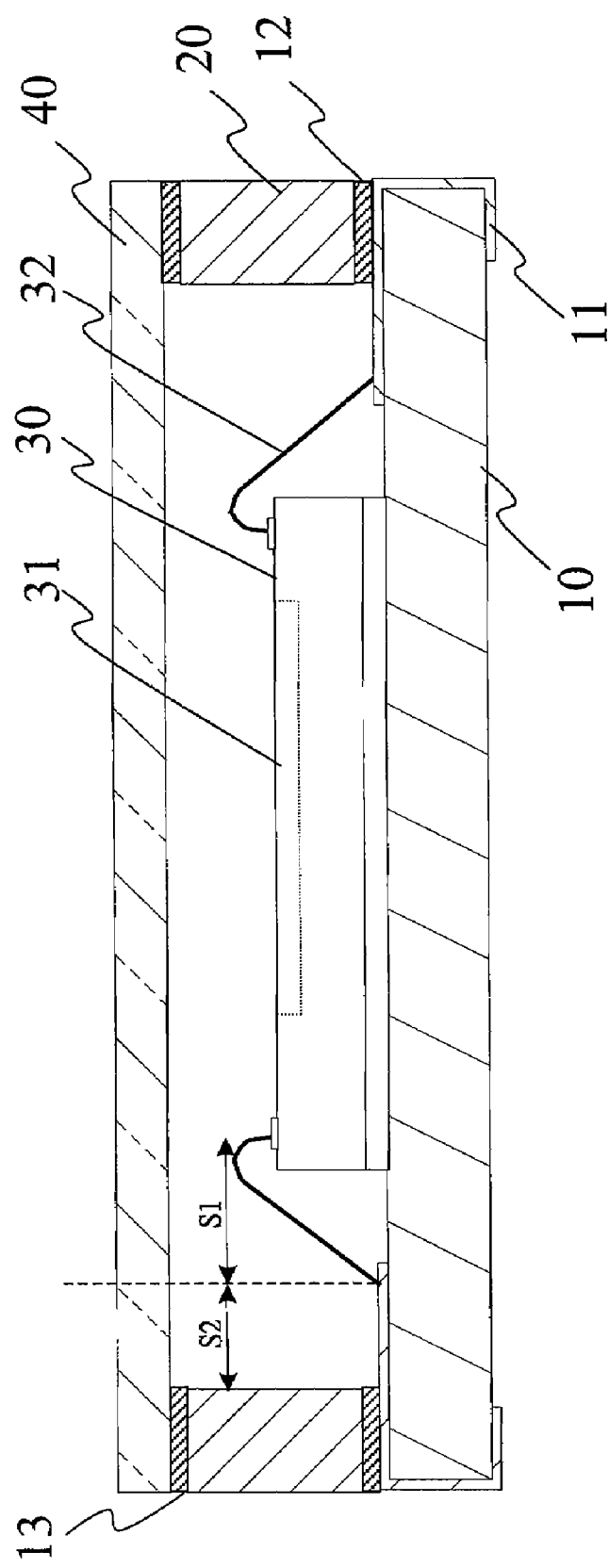
FIG. 1 is a diagram of the package structure of a conventional CMOS image sensing chip.
Figure 2:
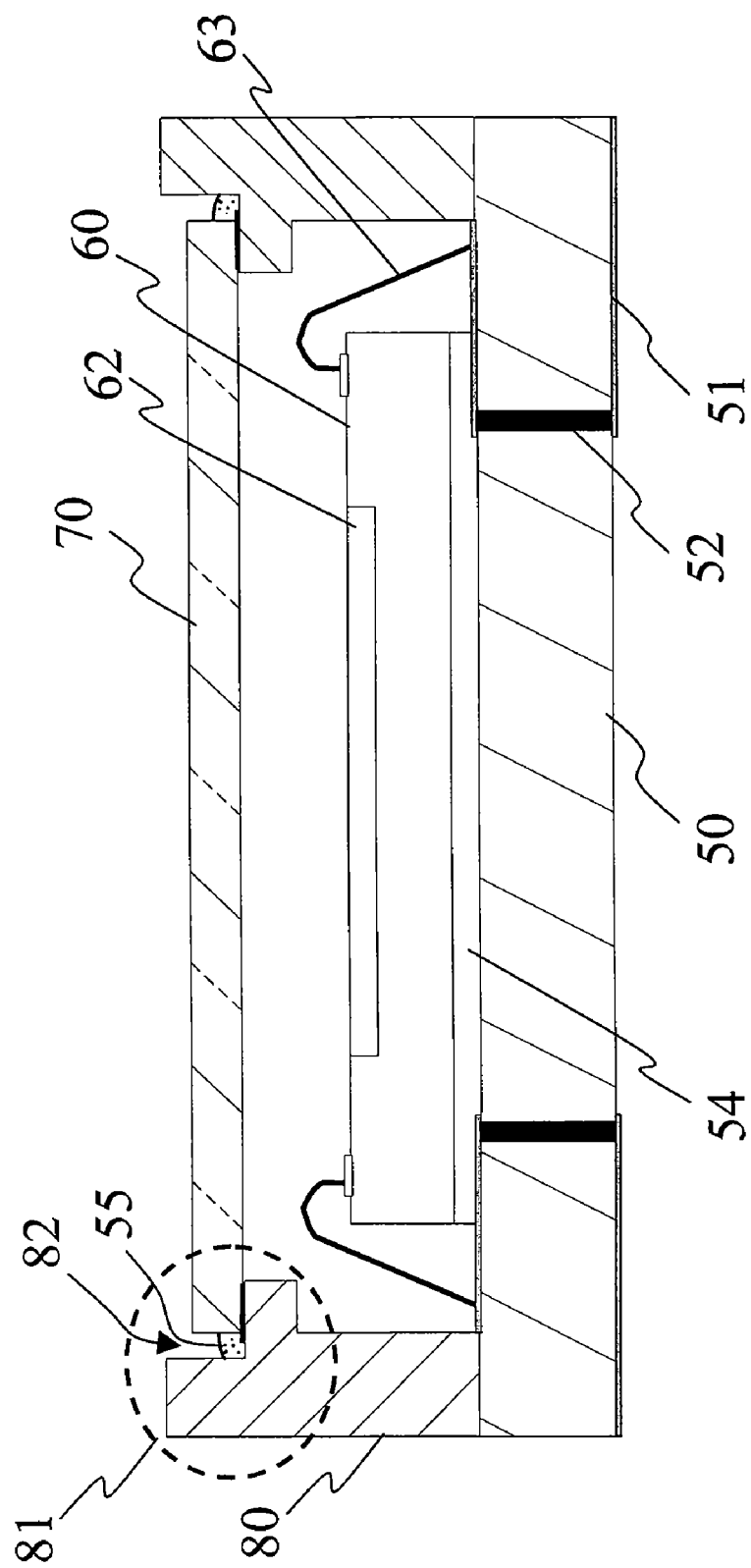
FIG. 2 is a diagram of the package structure of an image sensing chip of the present invention.

As shown in FIG. 2, an image sensor package structure according to an embodiment of the present invention comprises a substrate 50, an image sensing chip 60, a frame 80 and a light transparent layer 70.

The material of the substrate 50 can be BT (Bismaleimide Triazine) resin, FR5 resin or ceramic material. Several metallization traces 51 are disposed on both the upper and lower surfaces of the substrate 50. These metallization traces 51 penetrate through electroplated through holes 52 to achieve electrical connection. The image sensing chip 60 uses an adhesion layer 54 to adhere onto the upper surface of the substrate 50. The surface of the image sensing chip 60 has a sensing region 62. The image sensing chip 60 uses metal wires to connect the metallization traces by means of wire bonding so as to achieve electric connection with the substrate 50. The light transparent layer 70 is supported by the frame 80 and disposed above the image sensing chip 60. The light transparent layer 70 can be a light transparent glass or a lens capable of filtering out light within a specific optical wavelength range (e.g., a far infrared filtering lens for filtering out far infrared light).

In this embodiment, the frame 80 has a special structure design. The frame 80 is mounted on the substrate 50 and located around the image sensing chip 60. The frame 80 and the light transparent layer 70 form a structure body for protecting the image sensing chip 60 to prevent the image sensing chip 60 from contamination by external particles. The top of the frame 80 extends toward the image sensing chip 60 and upwards to form a locking and placing portion 81 with an L-shaped cross section. Bends of this locking and placing portion 81 form a placement space 82 to accommodate and position the light transparent layer 70. The light transparent layer 70 can use a glue layer 55 to adhere into the placement space 82 formed at the above locking and placing portion 81. The glue layer 55 can be UV glue or thermosetting glue.

In this embodiment, the locking and placing portion 81 is located inside the frame 80, and therefore won't waste extra space of the frame 80. Because the connection position of the light transparent layer 70 and the frame 80 is limited within the placement space 82 formed at the bends of the locking and placing portion 81, the gluing operation can be facilitated, and overflow of glue material to the surface of the image sensing chip 60 can be avoided. In order to further reduce the occurrence probability of overflow of glue material, the upper edge of the top of the frame 80 is raised to be higher than the upper edge of the light transparent layer 70, thereby stabilizing the production yield and quality.

Besides, the frame 80 having the locking and placing portion 81 with an L-shaped cross section is only of a simple geometric structure. Complicated manufacturing process and precision production machines are not required. Moreover, the packaging operation of the image sensor can be very easily aligned. Therefore, much manufacturing cost can be saved.

Furthermore, the image sensor package structure of the present invention can match a lens set with a smaller size for assembly. The volume and area of the whole image sensing module can be reduced to meet the requirement for miniaturized package of image sensor.

Figure 3:
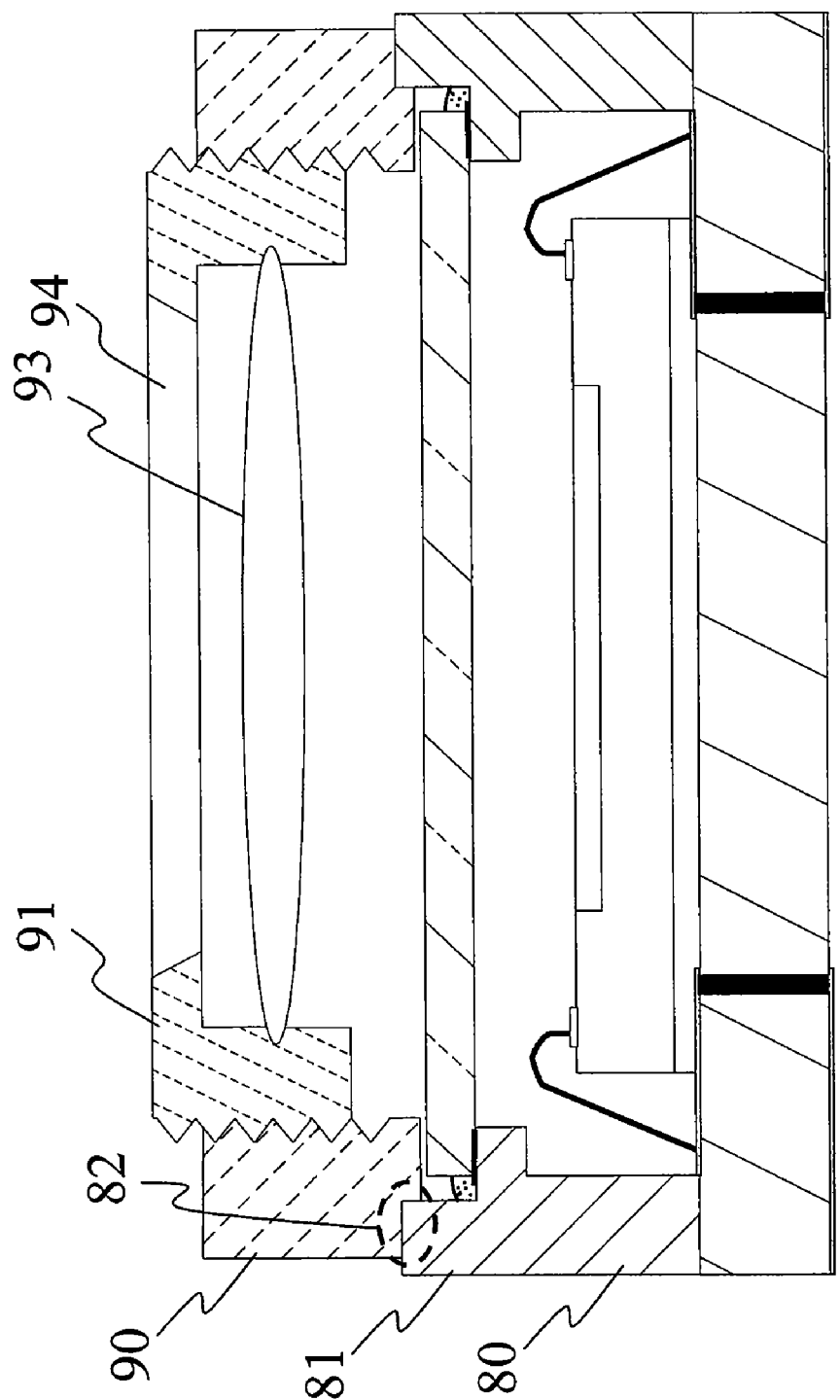
FIG. 3 is a diagram showing how the package structure of an image sensing chip of the present invention and a lens set are assembled into an image sensing module.

As shown in FIG. 3, a lens set comprises a lens base 90 and a lens tube 91. The lens base 90 is a hollow body with two open ends. A gap 92 is disposed at the outside of the bottom of the lens base 90 to be locked with the inside of the locking and placing portion 81 of the frame 80. The length and width of the lens base 90 can be smaller than or equal to those of the frame 80. The lens tube 91 includes a lens 93 and a through hole 94. The lens 93 receives a light source via the through hole 94 and focuses and transmits the light source to the image sensing chip 60. The lens tube 91 is movably sleeved into the lens base 90 so that the lens tube 91 can be protected and guided to make relative motion. The distance of the lens tube 91 relative to the image sensing chip 60 can thus be adjusted to change the focusing and imaging effect of the light source.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

We claim:

1. An image sensor package structure comprising:
a substrate having a plurality of metallization traces on a surface thereof; an image sensing chip mounted on said substrate and electrically connected to said metallization traces on said substrate;
a light transparent layer located above said image sensing chip; and a frame mounted on said substrate and around said image sensing chip, a top of said frame extending toward said image sensing chip and upwards to form a locking and placing portion with an L-shaped cross section, bend positions of said locking and placing portion forming a placement space to accommodate and position said light transparent layer;
a glue layer, wherein said glue layer is disposed between said light transparent layer and said locking and placing portion of said frame to glue and seal said light transparent layer and said frame; and
said substrate is made of BT (Bismaleimide Triazine) resin, FR5 resin or ceramic material.

2. The image sensor package structure as claimed in claim 1, wherein the height of an upper edge of said top of said frame is larger than that of an upper edge of said light transparent layer.

3. The image sensor package structure as claimed in claim 1, wherein said image sensing chip uses metal wires to electrically connect said metallization traces on said substrate.

4. The image sensor package structure as claimed in claim 1, wherein said light transparent layer is a light transparent glass or a filtering lens capable of filtering out specific optical wavelengths.

5. An image sensing module comprising:
a substrate having a plurality of metallization traces on a surface thereof;
an image sensing chip mounted on said substrate and electrically connected to said metallization traces on said substrate;
a light transparent layer located above said image sensing chip;
a frame mounted on said substrate and around said image sensing chip, a top of said frame extending toward said image sensing chip and upwards to form a locking and placing portion with an L-shaped cross section, bend positions of said locking and placing portion forming a placement space to accommodate and position said light transparent layer;
a lens base disposed on said frame; and
a lens tube movably sleeved in said lens base to make motions relative to said image sensing chip;
a glue layer, wherein said glue layer is disposed between said light transparent layer and said locking and placing portion of said frame to glue and seal said light transparent layer and said frame; and
said substrate is made of BT (Bismaleimide Triazine) resin, FR5 resin or ceramic material.

6. The image sensing module as claimed in claim 5, wherein the height of an upper edge of said top of said frame is larger than that of an upper edge of said light transparent layer.

7. The image sensing module as claimed in claim 5, wherein said image sensing chip uses metal wires to electrically connect said metallization traces on said substrate.

8. The image sensing module as claimed in claim 5, wherein said light transparent layer is a light transparent glass or a filtering lens capable of filtering out specific optical wavelengths.

9. The image sensing module as claimed in claim 5, wherein a gap is provided at an outer side of a bottom of said lens base to be locked with said locking and placing portion of said frame.

10. The image sensing module as claimed in claim 5, wherein the length and width of said lens base are smaller than or equal to those of said frame, respectively.

* * * * *